(12) United States Patent
Costrini et al.

(10) Patent No.: US 7,097,777 B2
(45) Date of Patent: Aug. 29, 2006

(54) MAGNETIC SWITCHING DEVICE

(75) Inventors: Gregory Costrini, Hopewell Junction, NY (US); John P. Hummel, Verbank, NY (US); George Stojakovic, Wappinger Falls, NY (US); Kia-Seng Low, Hopewell Junction, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/070,856

(22) Filed: Mar. 2, 2005
(Under 37 CFR 1.47)

(65) Prior Publication Data

US 2005/0207064 A1 Sep. 22, 2005

Related U.S. Application Data

(63) Continuation-in-part of application No. 10/283,348, filed on Oct. 30, 2002, now abandoned.

(51) Int. Cl.
*B44C 1/22* (2006.01)
(52) U.S. Cl. .............................. 216/22; 216/49; 216/54
(58) Field of Classification Search ................. 216/22, 216/49, 54
See application file for complete search history.

(56) References Cited

U.S. PATENT DOCUMENTS

| 5,650,958 A | 7/1997 | Gallagher et al. |
| 5,936,293 A * | 8/1999 | Parkin .................. 257/422 |
| 6,024,885 A | 2/2000 | Pendharkar et al. |
| 6,256,223 B1 | 7/2001 | Sun |
| 6,269,018 B1 | 7/2001 | Monsma et al. |
| 6,426,012 B1 | 7/2002 | O'Sullivan et al. |

(Continued)

FOREIGN PATENT DOCUMENTS

EP   1 109 170 A2   6/2001

(Continued)

OTHER PUBLICATIONS

Fang, T-N., et al., "2D Write Addressability of Tunneling Junction MRAM Elements," IEEE Transactions on Magnetics, vol. 37, No. 4 (Jul. 2001) pp. 1963-1966.

(Continued)

*Primary Examiner*—Nadine G. Norton
*Assistant Examiner*—Binh X. Tran
(74) *Attorney, Agent, or Firm*—Slater & Matsil, L.L.P.

(57) ABSTRACT

A method of forming a magnetic switching device is provided. The method includes depositing a bilayer hardmask, which may comprise a first mask layer of titanium nitride with a second mask layer of tungsten formed thereon. A first lithography process is performed to pattern the second mask layer, and a second lithography process is performed to pattern the first mask layer. Thereafter, the magnetic tunnel junction stack may be patterned in accordance with the first mask layer. An etching process may be performed to further pattern the first mask layer in accordance with the second mask layer. An optional passivation layer may be formed over the first mask layer and the second mask layer.

16 Claims, 3 Drawing Sheets

U.S. PATENT DOCUMENTS

| | | |
|---|---|---|
| 6,518,588 B1 | 2/2003 | Parkin et al. |
| 6,689,622 B1* | 2/2004 | Drewes .......................... 438/3 |
| 6,712,984 B1* | 3/2004 | Sasaki .......................... 216/22 |
| 2001/0041444 A1 | 11/2001 | Shields et al. |
| 2002/0006058 A1 | 1/2002 | Nakajima et al. |
| 2002/0097602 A1 | 7/2002 | Lammers |
| 2002/0098281 A1 | 7/2002 | Ning |
| 2002/0098678 A1 | 7/2002 | Ning et al. |
| 2002/0146887 A1 | 10/2002 | Liu et al. |
| 2005/0102720 A1* | 5/2005 | Lee ........................ 977/DIG. 1 |
| 2005/0110004 A1* | 5/2005 | Parkin et al. .................. 257/30 |

FOREIGN PATENT DOCUMENTS

WO    WO 02/065475 A2    8/2002

OTHER PUBLICATIONS

Kim, H-J., et al., "Digital Magnetoresistance Characteristics of NiFeCo/Cu/Co Spin-Valve Trilayers," IEEE Transactions on Magnetics, vol. 34, No. 2 (Mar. 1998) pp. 558-561.

Sousa, R.C., et al., "Influence of Ion Beam Milling Parameters on MRAM Switching," IEEE Transactions on Magnetics, vol. 37, No. 4 (Jul. 2001) pp. 1973-1975.

* cited by examiner

MAGNETIC SWITCHING DEVICE

This application is a continuation-in-part of patent application Ser. No. 10/283,348, entitled "Patterning Metal Stack Layers of Magnetic Switching Device, Utilizing a Bilayer Metal Hardmask," filed on Oct. 30, 2002, now abandoned which application is incorporated herein by reference.

TECHNICAL FIELD

The invention relates to magnetic switching devices and, more particularly to a method for patterning metal stack layers of a magnetic switching device.

BACKGROUND

Magnetic random access memory (MRAM or "MagRAM") is a solid-state device using magnetic thin film elements as a storage mechanism. The storage mechanism is dependent upon the relative orientation of the magnetization of two electrodes, and on the ability to detect this orientation by electrical means. MRAM arrays typically include an array of magnetic memory cells positioned at the intersections of wordlines and bitlines. Generally, each cell includes a magnetically changeable or "free" region, and a nearby magnetic reference region, arranged into a magnetic tunnel junction ("MTJ") device.

The principle underlying storage of data in these memory cells is the ability to change the relative orientation of the magnetization of the free and reference regions by changing the direction of magnetization along the easy axis ("EA") of the free region, and the ability to read this relative orientation difference thereafter. An MRAM cell is written by reversing the free region magnetization using applied bi-directional electrical and resultant magnetic stimuli via its received bitline and wordline. The MRAM cell is read by measuring the resultant tunneling resistance between the bitline and wordline, which assumes one of two values depending on the relative orientation of the magnetization of the free region with respect to the reference region. If the free region is modeled as a simple elemental magnet having a direction of magnetization which is free to rotate, but with a strong preference for aligning in either direction along its easy axis (+EA or −EA), and if the reference region is a similar elemental magnet but having a direction of magnetization fixed in the +EA direction, two states (and the two possible tunneling resistance values) are defined for the cell: aligned (+EA/+EA) and an-aligned (−EM +EA).

In operation, the MRAM device can be read by measuring the tunneling resistance to infer the magnetization state of the storage layer with respect to the fixed layer. The MRAM can be written by reversing the free layer magnetization using external magnetic fields. If the free layer is imagined as a simple elemental magnet which is free to rotate but with a strong energetic preference for aligning parallel to the X axis, and if the pinned layer is a similar elemental magnet but frozen in the +X direction, then there is at least two states possible for the device (e.g., aligned and anti-aligned in +X or −X directions).

In order to produce magnetic switching devices efficiently and with consistent results, there is a need for a method of fabricating and patterning the various layers of a magnetic switching device such that consistent results may be obtained.

SUMMARY OF THE INVENTION

One object of the present invention is to provide a method for patterning magnetic stack layers of a magnetic switching device to enable the critical lithography level to be made on a substantially planar surface.

Another object of the present invention is to provide a method for patterning magnetic stack layers of a magnetic switching device, wherein the method relies on etch selectivity between the hardmask layers chosen so as to enable practical process margins.

A further object of the present invention is to provide a method for patterning magnetic stack layers of a magnetic switching device so as to affect reactive ion etching (RIE) of the metal stack without breaking the vacuum, thereby mitigating the oxidation and/or corrosion from the ambient.

A yet further object of the present invention is to provide a method for patterning magnetic stack layers of a magnetic switching device without the use of polymers present in the etch chamber, so as to mitigate corrosive residuals.

A further object yet still of the present invention is to provide a method for patterning magnetic stack layers of a magnetic switching device so as to enable formation of $Al_2O_3$ layers around the magnetic device to reduce corrosive residuals and passivate the magnetic surface from subsequent oxidation and/or corrosion.

In general, an embodiment of the present invention provides a method for patterning metal stack layers of a magnetic switching device. The method comprises depositing a bilayer hardmask, which may comprise a first mask layer of titanium nitride with a second mask layer of tungsten formed thereon. A first lithography process is performed to pattern the second mask layer, and a second lithography process is performed to pattern the first mask layer. Thereafter, the magnetic tunnel junction stack may be patterned in accordance with the first mask layer. An etching process may be performed to further pattern the first mask layer in accordance with the second mask layer. An optional passivation layer may be formed over the first mask layer and the second mask layer.

DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Embodiments of the present invention provide a method that utilizes a bi-layer metal hardmask material to pattern a magnetic tunnel junction stack. Generally, the magnetic metal stack comprises a buffer layer of TaN/Ta having a thickness between about 25 Å to about 200 Å, a pinning layer of PtMn having a thickness from about 175 Å to about 375 Å, and a pinned magnet of NiFe having a thickness from about 40 Å to about 60 Å. A tunnel barrier of alumina having a thickness from about 10 Å to about 18 Å is then formed on the pinned magnetic layer. The final layers are the free magnetic layers, which may comprise NiFe (about 40 Å), capped with a Ta/TaN layer. Other stack configurations and materials may be used.

Figure 1:
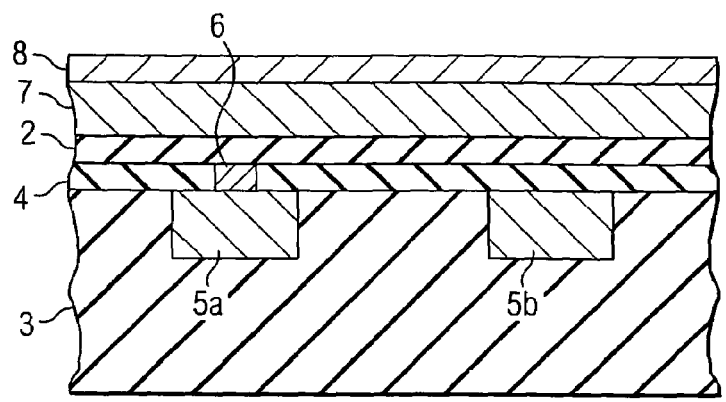
FIGS. 1–7 are cross-sectional views of a magnetic switching device after various stages of processing in accordance with an embodiment of the present invention.

Reference is now made to the drawings, in which FIG. 1 depicts a cross-sectional view of a wafer following the blanket deposition of the magnetic tunnel junction stack and a bilayer hardmask in accordance with an embodiment of the present invention.

In FIG. 1, conductive lines 5a and 5b are formed in a dielectric layer 3. In an embodiment, the dielectric layer 3 may be, for example, an oxide layer formed by chemical vapor deposition (CVD) techniques known in the art. Other materials and processes, such as plasma-enhanced CVD (PECVD), atomic-layer deposition (ALD), physical vapor deposition (PVD), or the like, may also be used. The conductive lines 5a and 5b may be, for example, copper or aluminum lines formed in the oxide layer.

An insulator layer 4, typically formed of an oxide, is deposited over the dielectric layer 3 and the conductive lines 5a and 5b. A via 6 may be formed through the insulator layer 4 to provide electrical contact to the conductive line 5a. One of ordinary skill in the art will appreciate that the conductive line 5a may be used for reading, and that the conductive line 5b may be used for writing.

A magnetic tunnel junction stack 2 is deposited over the insulator layer 3. The magnetic tunnel junction stack 2 is preferably a multi-layered stack. Generally, the magnetic tunnel junction 2 stack may comprise, for example, a buffer layer of TaN/Ta having a thickness between about 25 Å to about 200 Å, a pinning layer of PtMn having a thickness from about 175 Å to about 375 Å, and a pinned magnet of NiFe having a thickness from about 40 Å to about 60 Å. A tunnel barrier of alumina having a thickness from about 10 Å to about 18 Å is then formed on the pinned magnetic layer. The final layers are the free magnetic layer, which may comprise NiFe (about 40 Å), capped with a Ta/TaN layer. Other stack configurations and materials may be used.

A bi-layer hardmask, comprising a first mask layer 7 and a second mask layer 8, is formed over the magnetic tunnel junction stack 2. The first mask layer 7 may be formed by depositing a layer of TiN to a thickness from about 1,000 Å to about 2,000 Å on the magnetic tunnel junction stack 2, and the second mask layer 8 may be formed by depositing a layer of W to a thickness from about 500 Å to about 1,000 Å on the first mask layer 7.

Figure 2:
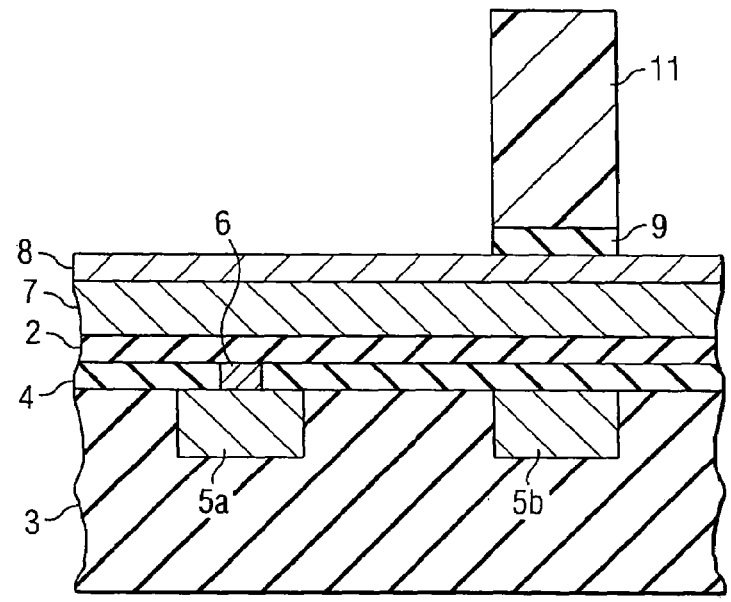

Proceeding from FIG. 1, FIG. 2 shows a first lithographic step made for patterning the device junction, and illustrates the exposed and developed resist feature on top of the hardmask. As will be seen in the following discussion, this lithography step is used to pattern the device junction and the device parametrics (and tolerance thereof). It should be noted that the wafer surface is substantially planar when this first lithographic step is performed, thereby allowing for an optimal field for exposure.

This photolithography step may be performed by depositing an anti-reflective coating (ARC) layer 9 and a photoresist layer 11. Thereafter, the photoresist layer 11 may be exposed in accordance with a desired pattern and developed. An etching process may be performed to pattern the ARC layer 9 as illustrated in FIG. 2. As a result, a portion of the second hardmask layer 8 is exposed over the conductive line 5a.

Figure 3:
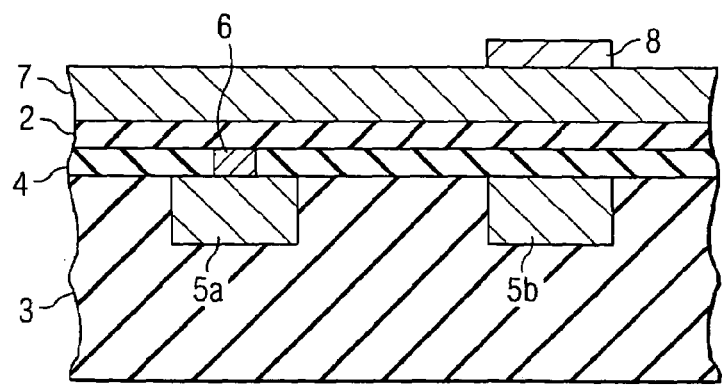

FIG. 3, an etching process is performed to remove exposed portions of the second hardmask layer 8, thereby exposing portions of the first hardmask layer 7, and the remaining portions of the ARC layer 9 and the photoresist layer 11 are removed. The etching of the second hardmask layer 8 may be performed using fluorinated plasma chemistries in a commercial process tool. The remaining portions of the ARC layer 9 and the photoresist layer 11 may be removed with available process chemistries in commercial tools.

Figure 4:
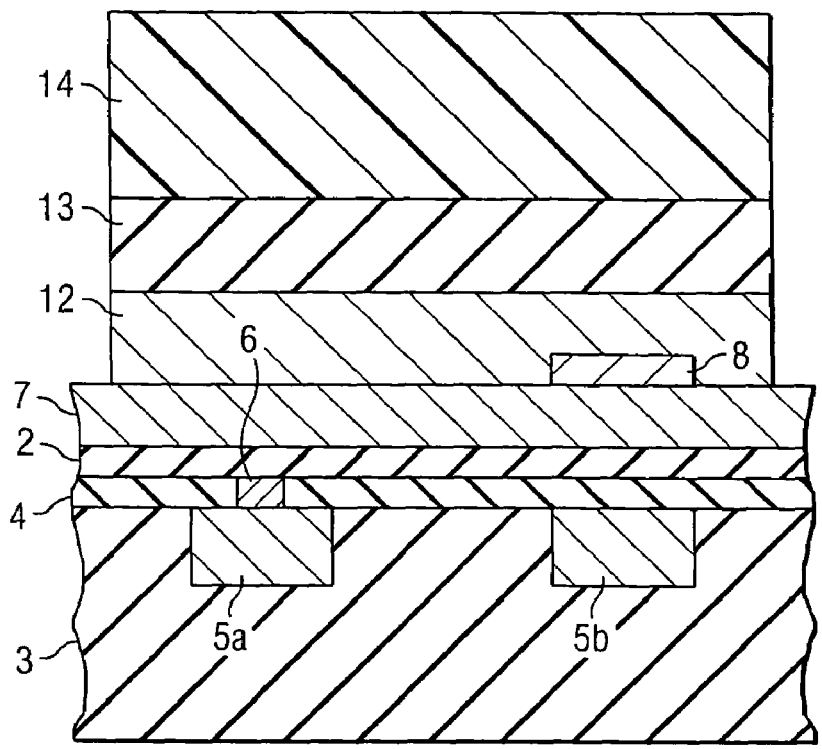

Next, as can be seen in FIG. 4, a second lithography step is used to pattern a mask in preparation of performing an etching process to pattern the first hardmask layer 7. The second lithography step may comprise depositing a third mask layer 12, an ARC layer 13, and a photoresist layer 14. After the photoresist layer 14 is patterned and exposed as discussed above, one or more etching processes may be performed to remove exposed portions of the third mask layer 12 and the ARC layer 13, thereby exposing portions of the first hardmask layer 7.

Figure 5:
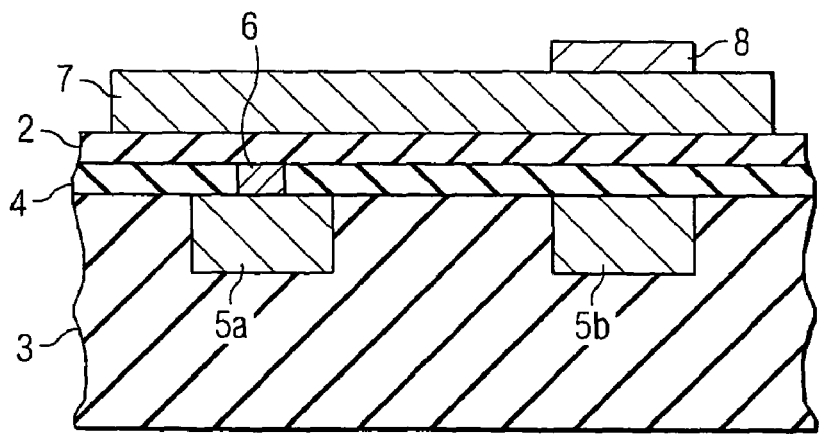

FIG. 5 illustrates the wafer after the first hardmask layer 7 is patterned and the remaining portions of the third mask layer 12, the ARC layer 13, and the photoresist layer 14 are removed. The first hardmask layer 7 may be patterned, for example, by using commercial plasma etch chemistries, such as chlorine-based chemistries commonly used for aluminum etch for chip wiring. The remaining portions of the third mask layer 12, the ARC layer 13, and the photoresist layer 14 are also removed using well-known processes. Following this step, the wafer is ready to etch the magnetic tunnel junction stack 2 to form the magnetic resistive device.

Figure 6:
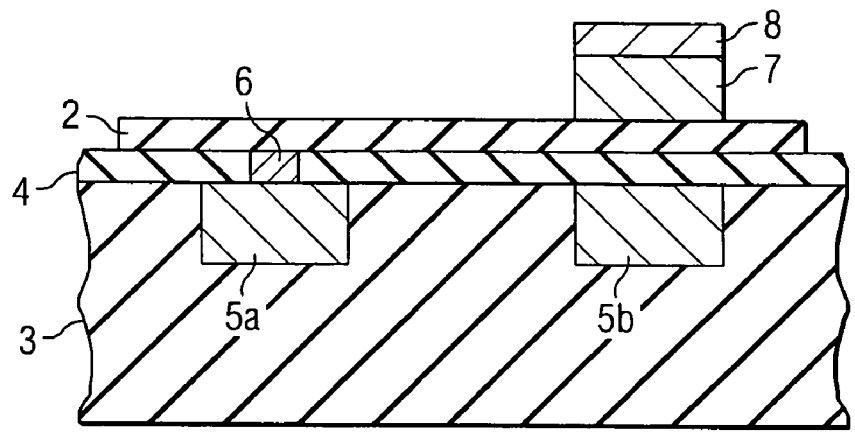

FIG. 6 illustrates the wafer after the magnetic tunnel junction stack 2 has been patterned and the exposed portions of the first hardmask layer 7 have been removed. The magnetic tunnel junction stack 2 may be patterned, for example, by using reactive ion etching (RIE) techniques using chlorine-based etch chemistries. Other etch chemistries and processes can also be used. It should be noted that an embodiment of the present invention provides a method for patterning magnetic tunnel junction stack 2 so as to affect RIE without breaking the vacuum, thereby mitigating the oxidation and/or corrosion from the ambient.

Following the patterning of the magnetic metal stack, the exposed portions of the first hardmask layer 7 are removed using the second hardmask layer 8 as a mask.

Figure 7:
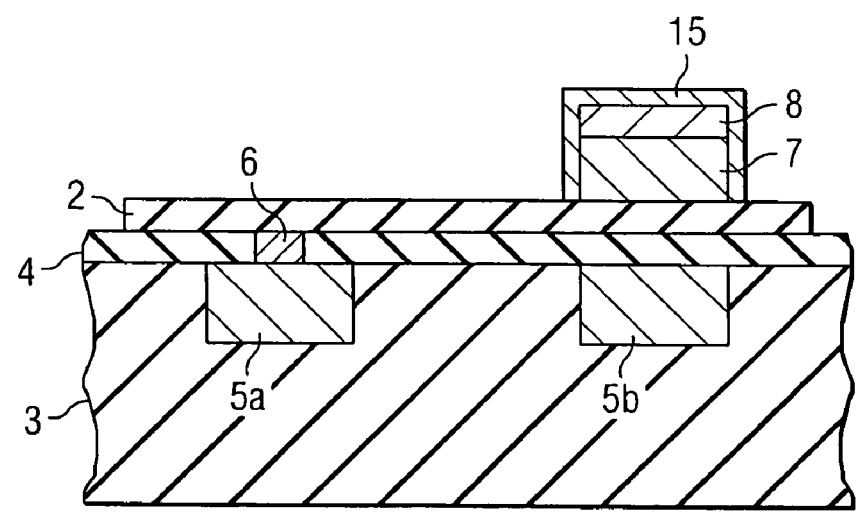

FIG. 7 illustrates an optional passivation layer 15, which may be formed of alumina for the purpose of reducing sidewall leakage, in accordance with an embodiment of the present invention. Ion milling may occur through the magnetic tunnel junction, and thus, a passivation layer may be utilized to cap the device. The passivation layer 15 may be formed by depositing a layer of aluminum followed by an oxidation process to form $Al_2O_3$ around the patterned metal stack layers of the magnetic switching device.

At this point the device is formed and subsequent processing steps to clean the wafer and deposit dielectric insulator materials into which is fabricated metal lines and contacts for the purpose of making electrical wiring between devices is made.

The method described utilizes a bilayer metal hardmask patterned in two lithography steps with concomitant hardmask open etch and resist strip steps. The hardmask materials should be chosen (e.g., W and TiN) such that mask open etch chemistry may be designed with good selectivity. This enables patterning of the hardmask layers prior to etching of the metal stack layers.

Several advantages are inherent with this approach. First, the critical lithography level can be made on planar substrates with little or no topography. The second lithography step sees only little topography from the top patterned hardmask, which can be planarized with application of a standard organic ARC.

Another advantage inherent in the invention method is that the metal stack layers can be etched in one process sequence without exposure to ambient conditions. This is significant in that reaction of ambient water vapor with chlorinated etch byproducts is a standard problem with Cl-based metal etching and reducing or eliminating this problem significantly improves the process yield.

In summary, the advantages of the invention method for formation of the magnetic switching device are:) the critical lithography level is made on a planar surface; the process relies on etch selectivity between the two metal hardmask layers, tungsten and titanium nitride, chosen as an example, to enable practical margins; the reactive ion etching of the metal stack is done without breaking the vacuum, thereby mitigating the oxidation and/or corrosion from the ambient; the metal stack etch is made without polymers present in the etch chamber, thereby mitigating corrosive residuals; and the method is used for formation of $Al_2O_3$ layer around the magnetic device to getter corrosive residuals and passivate the metal surface from subsequent oxidation and/or corrosion.

What is claimed is:

1. A method of patterning metal stack layers of a magnetic switching device, the method comprising:
   providing a substrate having a first conductive line and a second conductive line formed therein and having a first dielectric layer formed over the substrate, the first dielectric layer having a via formed therethrough, the via being in electrical contact with the first conductive line, a magnetic tunnel junction stack being formed over the first dielectric layer;
   forming a first hardmask layer over the magnetic tunnel junction stack;
   forming a second hardmask layer over the first hardmask layer;
   patterning the second hardmask layer such that a first portion of the second hardmask layer over the first conductive line is removed and a second portion of the second hardmask layer over the second conductive line remains;
   patterning the first hardmask layer such that a portion of the first hardmask layer overlying the first conductive line and the second conductive line remains;
   patterning the magnetic tunnel junction stack in accordance with remaining portions of the first hardmask layer; and
   patterning the first hardmask layer in accordance with remaining portions of the second hardmask layer.

2. The method of claim 1, wherein the first hardmask layer comprises titanium nitride.

3. The method of claim 1, wherein the first hardmask layer is of a thickness from about 1000 Å to about 2000 Å.

4. The method of claim 1, wherein the patterning of the first hardmask layer is performed by photolithography techniques.

5. The method of claim 1, wherein the patterning of the second hardmask layer is performed by photolithography techniques.

6. The method of claim 1, wherein the second hardmask layer comprises tungsten.

7. The method of claim 6, wherein the second hardmask layer is of a thickness from about 1000 Å to about 2000 Å.

8. The method of claim 1, further comprising forming a passivation layer on remaining portions of the first hardmask layer and the second hardmask layer.

9. The method of claim 8, wherein the forming the passivation layer comprises depositing an aluminum layer and performing an oxidation process.

10. The method of claim 1, wherein the magnetic tunnel junction stack comprises a buffer layer of TaN/Ta, a pinning layer of PtMn, and a pinned magnet of NiFe.

11. The method of claim 10, wherein the pinned layer of PtMn is of thickness from between about 175 Å to about 375 Å.

12. The method of claim 10, wherein the pinned magnet of NiFe is of a thickness from about 40 Å to about 60 Å.

13. The method of claim 10, wherein a tunnel barrier of alumina is formed on the pinned magnet.

14. The method of claim 13, wherein the tunnel barrier of alumina is of a thickness from about 10 to about 18 Å.

15. The method of claim 13, wherein a free magnetic layer of NiFe is formed over the tunnel barrier of alumina.

16. The method of claim 15 wherein the free magnetic layer of NiFe is capped with a layer of Ta/TaN.

* * * * *